(12) United States Patent
Whatmore et al.

(10) Patent No.: US 6,774,746 B2
(45) Date of Patent: Aug. 10, 2004

(54) THIN FILM BULK ACOUSTIC RESONATOR FILTERS WITH A PIEZOELECTRIC LAYER OF LEAD SCANDIUM TANTALUM OXIDE

(75) Inventors: Roger W. Whatmore, Milton Keynes (GB); Paul B. Kirby, Northampton (GB); Qingxin Su, Xi'an (CN); Eiju Komuro, Funabashi (JP)

(73) Assignee: TDK Corporation, Tokyo (JP)

( * ) Notice: Subject to any disclaimer, the term of this patent is extended or adjusted under 35 U.S.C. 154(b) by 94 days.

(21) Appl. No.: 10/031,240

(22) PCT Filed: May 23, 2001

(86) PCT No.: PCT/GB01/02292

§ 371 (c)(1),
(2), (4) Date: Apr. 2, 2002

(87) PCT Pub. No.: WO01/91289

PCT Pub. Date: Nov. 29, 2001

(65) Prior Publication Data

US 2002/0118079 A1 Aug. 29, 2002

(30) Foreign Application Priority Data

May 24, 2000 (GB) .............................................. 0012439

(51) Int. Cl.⁷ ................................................ H03H 9/54
(52) U.S. Cl. ........................ 333/189; 333/188; 333/191; 310/312
(58) Field of Search ................................ 333/186–192; 310/312

(56) References Cited

U.S. PATENT DOCUMENTS

| | | | |
|---|---|---|---|
| 3,549,414 A | * 12/1970 | Curran et al. | ................ 333/188 |
| 4,320,365 A | 3/1982 | Black et al. | ................. 333/187 |
| 5,587,620 A | * 12/1996 | Ruby et al. | ................. 310/346 |
| 5,692,279 A | * 12/1997 | Mang et al. | ................. 29/25.35 |
| 5,873,153 A | 2/1999 | Ruby et al. | ................. 29/25.35 |
| 5,873,154 A | 2/1999 | Ylilammi et al. | ........... 29/25.35 |
| 5,894,647 A | * 4/1999 | Lakin | ......................... 29/25.35 |
| 6,051,907 A | * 4/2000 | Ylilammi | ..................... 310/312 |
| 6,060,818 A | * 5/2000 | Ruby et al. | ................. 310/363 |
| 6,093,338 A | * 7/2000 | Tani et al. | .............. 252/62.9 R |
| 6,307,447 B1 | * 10/2001 | Barber et al. | ................ 333/188 |
| 6,339,276 B1 | * 1/2002 | Barber et al. | ................ 310/312 |
| 6,377,136 B1 | * 4/2002 | Rittenhouse et al. | ........ 333/188 |
| 6,388,544 B1 | * 5/2002 | Ella | .......................... 333/189 |
| 6,407,649 B1 | * 6/2002 | Tikka et al. | ................. 333/133 |
| 6,441,702 B1 | * 8/2002 | Ella et al. | ................... 333/188 |
| 6,469,597 B2 | * 10/2002 | Ruby et al. | ................. 333/187 |

FOREIGN PATENT DOCUMENTS

| | | |
|---|---|---|
| EP | 0 669 713 A1 | 8/1995 |
| EP | 0-771-070 A2 | 5/1997 |
| EP | 0-880-227 A2 | 11/1998 |
| EP | 0 949 756 A2 | 10/1999 |
| WO | WO 98/15984 | 4/1998 |

* cited by examiner

Primary Examiner—Barbara Summons
(74) Attorney, Agent, or Firm—Oliff & Berridge, PLC

(57) ABSTRACT

An electric filter comprises a plurality of thin film bulk acoustic resonators arranged in series and in parallel which have different thicknesses of one or more non-piezoelectric layers, for example top electrode.

48 Claims, 9 Drawing Sheets

THIN FILM BULK ACOUSTIC RESONATOR FILTERS WITH A PIEZOELECTRIC LAYER OF LEAD SCANDIUM TANTALUM OXIDE

FIELD OF THE INVENTION

The present invention relates to a filter comprising plural thin film bulk acoustic resonators (FBARs) and more particularly, is directed to a piezoelectric filter which is manufactured using thin film technology in order to obtain a wide band-pass at high frequency.

BACKGROUND OF THE INVENTION

Thin film bulk acoustic resonators (FBARs) are attractive devices since they show resonant peaks at high frequency, particularly in the MHz and GHz regions. Moreover, FBARs can be achieved in a small device size (~mm). Thus, they are considered to be useful not only as resonators, but to be applied to filters, transducers, etc., which would be installed in small, light, thin electric appliance products, such as mobile telephones.

It is well known that the resonant frequency of a piezoelectric resonator such as an FBAR can be changed with the thickness of the piezoelectric layer. Also, it has been reported that the resonant frequency of an FBAR can be changed by changing the thicknesses of other layers such as the electrodes, any underlying membrane layer or the underlying substrate. This effect is called a "mass loading effect". The mass loading effect is observed particularly in MHz and GHz region. The mass loading effect is based on the fact that the resonant frequency is changed by a change in the weight in a unit area of the device. Therefore, for instance, the resonant frequency can also be changed by altering the material used for electrodes because the weight of the electrodes is changed when densities for the electrode materials are different, even if the thickness is the same.

Using the mass loading effect, it has been proposed previously that the frequency of an FBAR can be tuned by increasing or decreasing a thickness of an electrode or a membrane layer. This method has the advantage that the frequency can be tuned after making the FBAR device because it is possible in principle to increase or decrease the thickness of a top electrode. In other words, the resonant frequency can be adjusted to what is desired, by first checking the resonance of the FBAR device and then altering the electrode thickness appropriately. However, because an FBAR consists of a thin piezoelectric layer between 2 metal electrodes, it is not easy to tune the resonant frequency by altering the piezoelectric layer thickness after top electrode deposition. A method for metal ablation (such as pulsed laser illumination or ion beam etching) would need to be used.

It is known that an electric filter can be made with plural FBARs. This kind of filter can work in the MHz or in the GHz frequency regions. Generally speaking, for a band-pass filter, the rejection level for out-of-band signals relative to the pass-band improves when more FBARs are used for the filter.

FIG. 7 shows one example of a filter comprising four FBARs. The four FBARs are separated into 2 groups according to their functions in the filter. FBAR1 and FBAR2 in FIG. 7 are connected in series. Therefore they form one group. Also, FBAR3 and FBAR4 are connected in parallel and form the other group. Usually all the FBARs are prepared simultaneously and on one substrate under the same procedures. Therefore each FBAR consists of very closely matched (ideally identical) structures. In other words, the same thicknesses and the same materials are used for all the layers in each FBAR.

It is important to prepare a band-pass filter at high frequency in MHz or GHz region because those frequency regions are often used for wireless communications these days. The bandwidth of the filter is demanded to be wider or narrower sometimes. In order to make the bandwidth wider for a filter which is employing FBARs, a piezoelectric material which shows high electromechanical coupling coefficient should be applied to the FBARs because the bandwidth of each FBAR depends mainly on the electromechanical coupling coefficient. However, it is sometimes difficult to apply a material which shows high electromechanical coupling coefficient ($\kappa$) for FBAR because of process problems. Also, there is a limit to the electromechanical coupling coefficient. Practically, no thin film piezoelectric materials are known with $\kappa > 0.45$.

SUMMARY OF THE INVENTION

The present invention describes a wide bandpass filter which comprises plural FBARs. In detail, by this invention a wide bandpass region can be obtained by changing thicknesses of the non-piezoelectric layers in the series relative to the parallel FBARs.

The filter comprises a plurality of FBARs of which at least one FBAR is in series and one FBAR in parallel. Each FBAR comprises a plurality of layers consisting of (from lower to upper): a substrate, a dielectric layer, one or more metal layers acting as a lower electrode, a piezoelectric layer, one or more metal layers acting as an upper electrode and any top layer (optional) which might be added to effect further adjustable mass loading. This final layer can be either a conductor or an insulator.

An FBAR exhibits a series resonance and a parallel resonance at respective frequencies that are functions of the thicknesses of the layers. In the filter, it is desirable to control the thicknesses of one or several layer(s) between FBARs in series and FBARs in parallel. In this way series and parallel resonant peaks are engineered to be at different frequencies for the FBARs in series relative to those in parallel.

As a result of making a filter using those FBARs in series and in parallel, a wide band-pass filter can be obtained. In this case, the thickness of the piezoelectric layer is not supposed to be changed for the FBARs in series relative to those in parallel. The thicknesses of one or more of the following layer(s) are changed: electrodes, membrane layer, any remaining substrate, the top (optional) layer.

The theory of the device is described using FIG. 7. In FIG. 7, if all FBARs are prepared under the same condition and with layers of materials of the same type and the same thicknesses, both FBARs in series (FBARs 1 and 2) and FBARs in parallel (FBARs 3 and 4) are identical and exhibit exactly the same resonant peaks as shown in FIG. 8(*a*). As a result of making a filter using FBARs in series and parallel which are identical, the width of the band-pass is limited, with the frequency of the series resonance ($f_s$) and a frequency of the parallel resonance ($f_p$), as shown in FIG. 8(*b*).

On the other hand, if in FIG. 7, it is assumed that the thicknesses of the top electrodes for the FBARs in series are different from those on the FBARs in parallel while the other dimensions on all FBARs are the same, then the FBARs in series and FBARs in parallel show their resonant peaks at different frequencies, as shown in FIG. 9(*a*). In FIG. 9(*a*), the frequency of the series resonance of the FBARs in series ($f_{s1}$) is set at the same frequency as the parallel resonance of the FBARs in parallel ($f_{p2}$). As a result of preparing a filter using those different FBARs in series and in parallel, the bandwidth of the filter increases. This is because the width of the bandpass is limited by the frequency of the series resonance of the FBARs in parallel ($f_{s2}$) and the frequency of the parallel resonance of the FBARs in series ($f_{p1}$), as shown in FIG. 9(b).

There are two merits of the filter in FIG. 9(b) relative to that in FIG. 8(b). One is that the close-in rejections at $f_{s2}$ and $f_{p1}$ in FIG. 9(b) are deeper than those at $f_s$ and $f_p$ in FIG. 8(b). The other is that the insertion loss in the band-pass region between $f_{s2}$ and $f_{p1}$ in FIG. 9(b) is less than that between $f_s$ and $f_p$ in FIG. 8(b).

An important point of the proposed filter is that all FBARs both in series and in parallel comprise the same thickness of piezoelectric layer. On the proposed filter, it is essential to alter a thickness of one or several layer(s) except the piezoelectric layer between FBARs in series and FBARs in parallel. The layer(s) which show(s) the different thicknesses is/are supposed to be one or several layer(s) of electrodes, a membrane layer, any remaining substrate and so on but not the piezoelectric layer.

A method for altering the thickness of one of these layers will now be described. In order to alter the thickness of the top electrode, for instance, photolithography can be used to cover some FBARs with photoresisit, after applying the top electrode with a certain coating thickness. The thickness of the top electrode in the uncoated areas can be reduced by chemical or dry etching (e.g. ion milling and/or reactive ion etching) or can be increased by applying a further coating of metal or some other material, which can be insulating. Alternatively, by using photolithography, since a top electrode can be prepared in particular areas, top electrode areas with different thicknesses can be obtained by repeating the photolithography and coating for different device areas. In this case there is no need for electrode etching or for coating over existing top electrode areas.

Another good example of a method for controlling the thickness of the top electrodes in particular areas is described as follows. Excimer laser pulses, which can be focussed into spots of very small areas, can be used to etch the top electrodes locally. During the etching or before and after the etching, the resonant frequencies of the devices being etched can be monitored. In this case, it is very quick and precise to obtain the required frequencies for particular FBARs.

It should be noted that when attempts are made to locally reduce the thickness of the piezoelectric layer by etching, it can occur that the surface of the etched piezoelectric layer becomes rough. That rough surface may cause a loss of signal because resonance occurs in the said piezoelectric layer. Alternatively, when attempts are made to locally increase the thickness of the piezoelectric layer by coating over an existing piezoelectric layer, it is possible that the film properties of the added piezoelectric layer are changed relative to the existing one. Moreover, if attempts are made to change the resonant frequency by changing the thickness of the piezoelectric layer, it is difficult to check the resonant frequency of the device because the piezoelectric layer needs to have a top and a bottom electrode on both sides to allow the resonance to be excited electrically. This makes it hard to increase or decrease the thickness of the piezoelectric layer within such a sandwich structure between the electrodes. For these reasons, it is important to change the thickness of one or some layers other than the piezoelectric layer on FBARs in order to make the proposed filter.

BRIEF DESCRIPTION OF THE DRAWINGS

The invention will now be described in more detail, by way of example only, with reference to the accompanying drawings, wherein.

DETAILED DESCRIPTION OF THE EXEMPLARY EMBODIMENTS

According to a preferred embodiment of the invention, the filter is prepared with FBARs in series and in parallel which have different thickness of top electrode. The embodiment may be understood in view of FIGS. 1 and 2, which illustrate a schematic diagram of the filter and a cross-section of each FBAR in the filter.

Figure 1:
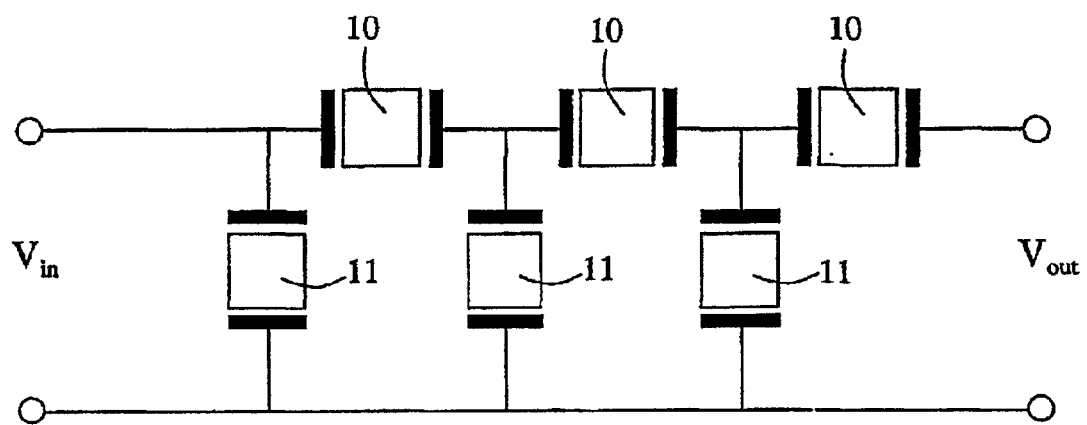
FIG. 1 illustrates a schematic diagram of a preferred filter which comprises three FBARs in series and three FBARs in parallel.
Figure 2:
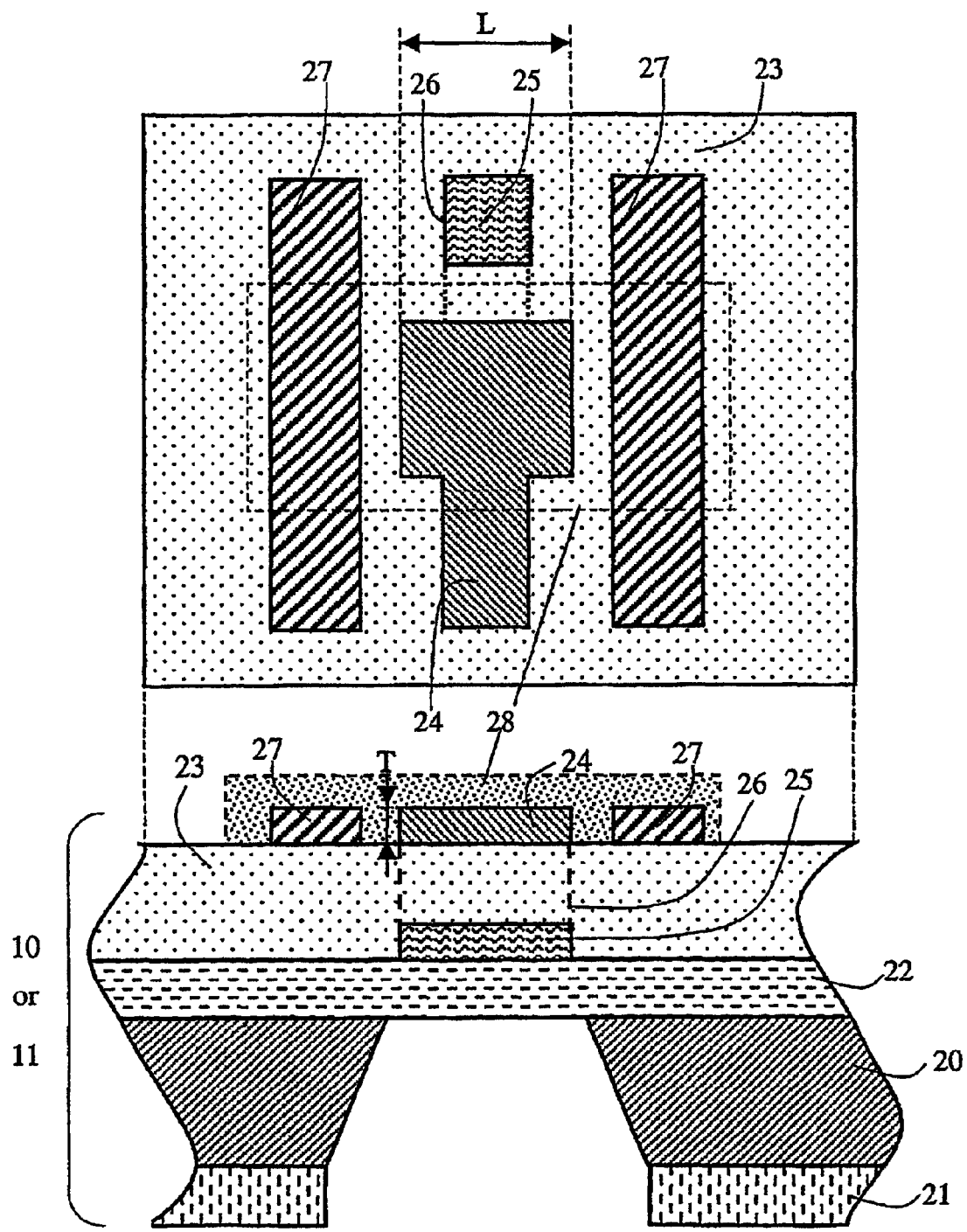
FIG. 2 illustrates a top view and a cross section view of a FBAR.

Three FBARs in series 10 are the same ones in FIG. 1. Also, the three FBARs in parallel 11 are the same ones. Those six FBARs are prepared on one substrate. The FBARs in series 10 and in parallel 11 have a structure shown in FIG. 2. The FBARs in series 10 and in parallel 11 comprise a top electrode 24, a bottom electrode 25, a piezoelectric layer 23 and a bridge or membrane layer 22 on a Si wafer 20 which is etched anisotropically using a backside pattern layer 21. However, in this embodiment there is only one difference between the FBARs in series 10 and in parallel 11. That difference is the thickness of the top electrode 24 (shown as T in FIG. 2).

The preparation procedure of the filter, comprising six FBARs, is described as follows. At first, silicon nitride (SiN$_x$) is coated at 200 nm with chemical vapour deposition on both sides of a bare Si wafer 20. The SiN$_x$ membrane layer 22 is also at the front side of the Si wafer 20. At the back side of the Si wafer 20, patterns are prepared with photolithography and reactive ion etching in the SiN$_x$, as defined by the backside layer pattern 21. A bottom electrode 25 is prepared with the so-called lift-off process which is carried out as follows. First a pattern of photoresist is prepared with photolithography. Then, chromium and gold (Cr/Au) are deposited by sputtering at thicknesses at 10 nm and 100 nm, respectively. Cr is used as an adhesion layer for the Au. Next, the patterned photoresist and Cr/Au on it is removed with acetone because the photoresist dissolves into acetone. After that procedure, a bottom electrode 25 is obtained. Next, Zinc Oxide (ZnO) is deposited to form the piezoelectric layer 23 by sputtering. The thickness of the piezoelectric layer 23 is 1.2 microns. The piezoelectric layer 23 is etched with acetic acid to make a contact hole 26 in order to touch a bottom electrode 25 with an electrical probe. Afterwards, a top electrode 24 is prepared by the lift-off process. The top electrode 24 has a transmission line and a square working area on which one dimension is 200 microns, shown as L in FIG. 2. The working area size is the same for a bottom electrode 25. When the top electrode 24 is prepared, two ground electrodes 27 are prepared as well under the same lift-off process, so the top electrode 24 has a coplanar wave-guide structure for which the characteristic impedance is set at about 50 ohms.

The Au thickness of a top electrode 24 is set at 100 nm for FBARs in series 10 and at 120 nm for FBARs in parallel 11 while the Cr thickness is the same (10 nm) for both FBARs in series 10 and for FBARs in parallel 11. When those top electrodes 24 are prepared, Cr/Au coatings and lift-off processes are carried out twice. At first, a top electrode 24 is prepared on FBARs in series 10 at 100 nm of Au and then repeated the preparation process of a top electrode 24 again on the FBARs in parallel 11 to deposit a top electrode 24 at 120 nm of Au.

Finally, the Si wafer 20 is etched from its backside with KOH solution, using the backside pattern layer 21 and the preparation process for the filter is finished.

A network analyser is used for the electrical measurement. At first, a measurement is carried out on each FBAR in the filter. Each FBAR, which is not connected to the other FBARs, is prepared individually in order to measure the electrical response separately.

Figure 3:
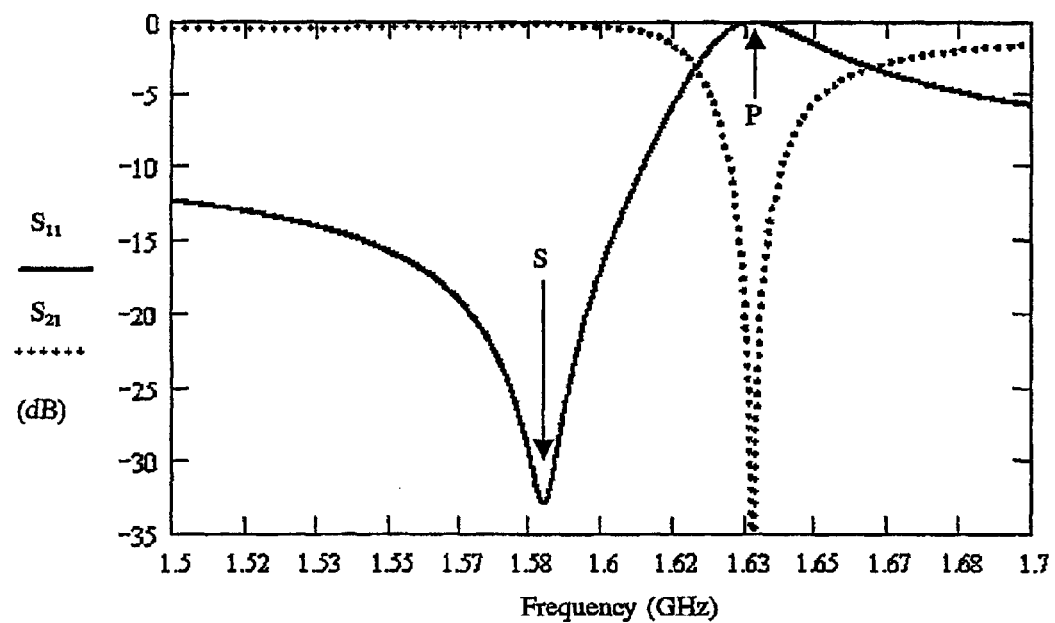
FIG. 3 shows the S parameters of a FBAR which comprises a top electrode at 100 nm and which is used as FBARs in series on a preferred filter.

FIG. 3 shows the S parameters of a FBAR in series 10, which has a top electrode of 100 nm thick. $S_{11}$ is the reflection coefficient to the power source and $S_{21}$ is through coefficient as measured at an output port. The series and parallel resonant peaks are presented on $S_{11}$ at the frequency of 1.585 GHz and 1.632 Ghz, shown as "S" and "P" in FIG. 3. One resonant peak appears on $S_{21}$ at 1.632 GHz.

Figure 4:
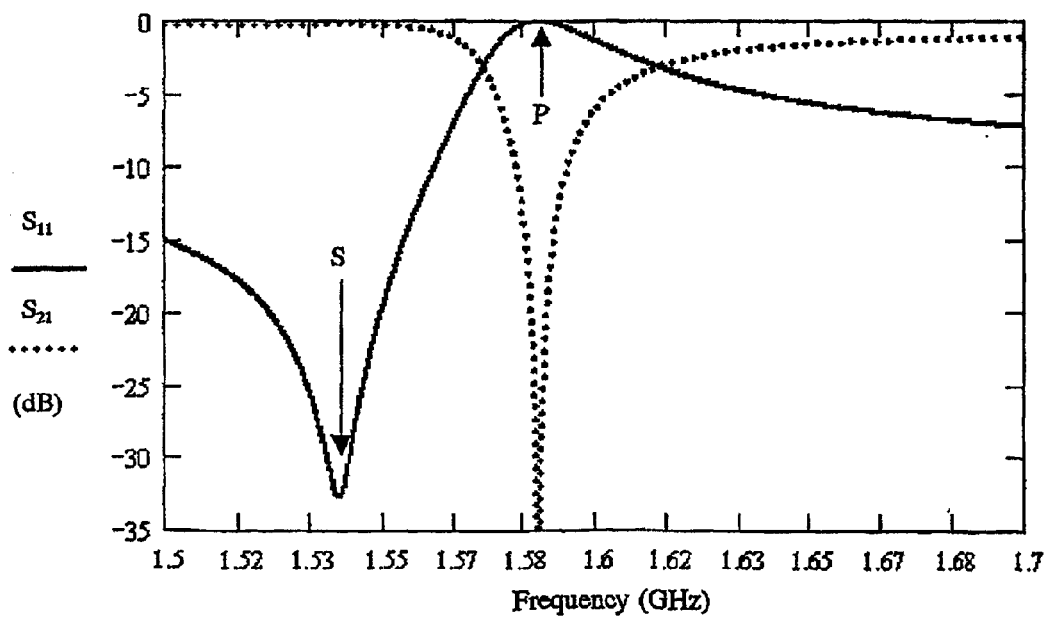
FIG. 4 shows the S parameters of a FBAR which comprises a top electrode at 120 nm and which is used as the FBARs in parallel in a preferred filter.

On the other hand, FIG. 4 shows the S parameters of a FBAR in parallel 11, which has a top electrode 24 of 120 nm thick. All the resonant peaks on $S_{11}$ and $S_{21}$ are shifted to lower frequency than the same kinds of peaks in FIG. 3. The series resonant peak on $S_{11}$ appears at 1.538 GHz. Both the parallel resonant peak on $S_{11}$ and a resonant peak on $S_{21}$ are presented at 1.585 GHz which is the same frequency as for the series resonant peak of $S_{11}$ in FIG. 3.

Figure 5:
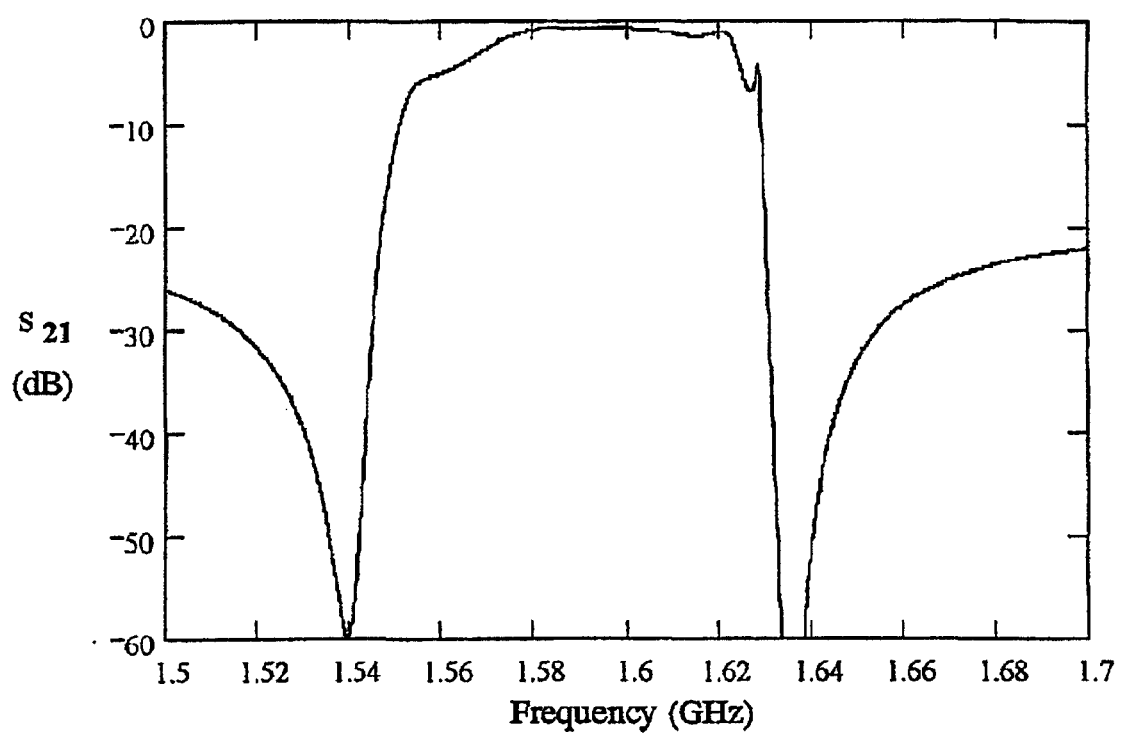
FIG. 5 illustrates the $S_{21}$ curve of a preferred filter which comprises three identical FBARs in series, each possessing a top electrode at 100 nm thick and three identical FBARs in parallel, each possessing a top electrode at 120 nm.

Using those two kinds of FBARs, the filter is fabricated using the configuration shown in FIG. 1. The through coefficient ($S_{21}$) of the filter is shown in FIG. 5. Close-in rejections of the filter appear at 1.540 GHz and at 1.635 GHz. One close-in rejection at 1.540 GHz is due to a series resonant peak on $S_{11}$ at 1.538 GHz. The other close-in rejection at 1.635 GHz is due to a resonant peak of $S_{21}$ at 1.632 GHz. A frequency width from one close-in rejection to the other close-in rejection is 0.095 GHz.

Figure 6:
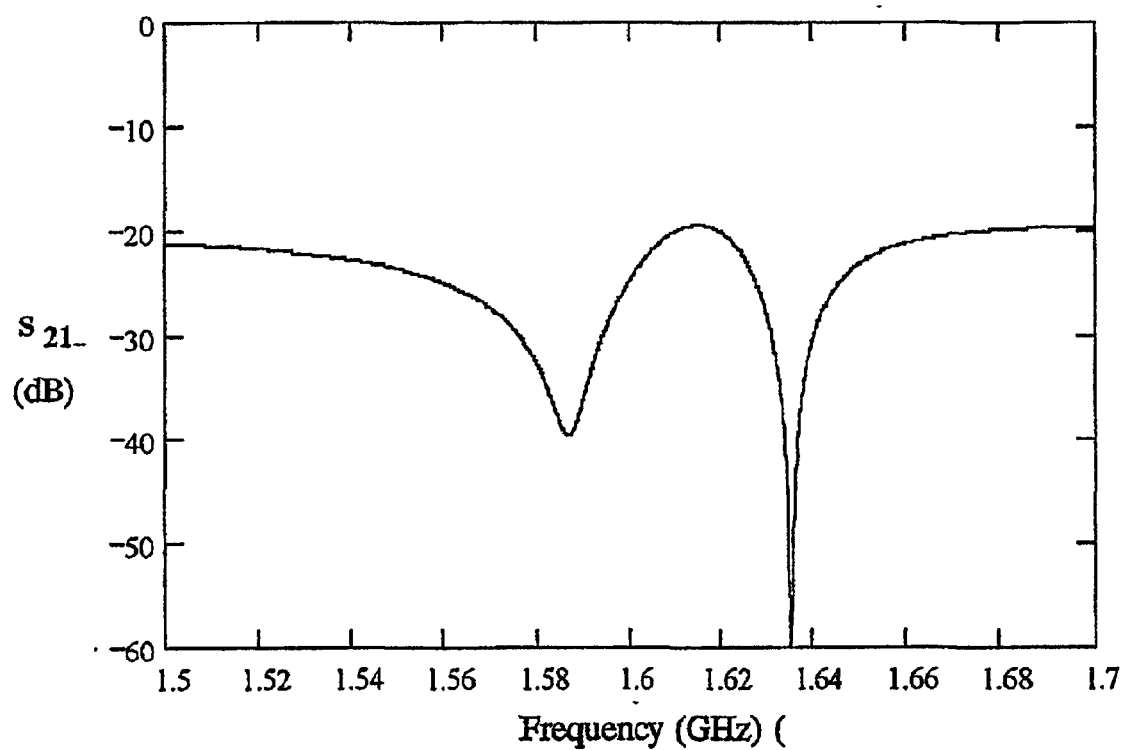
FIG. 6 illustrates a $S_{21}$ curve of a compared filter which comprises six identical FBARs of which three FBARs are in series and three FBARs in parallel. All possess a top electrode at 100 nm thick.
Figure 7:
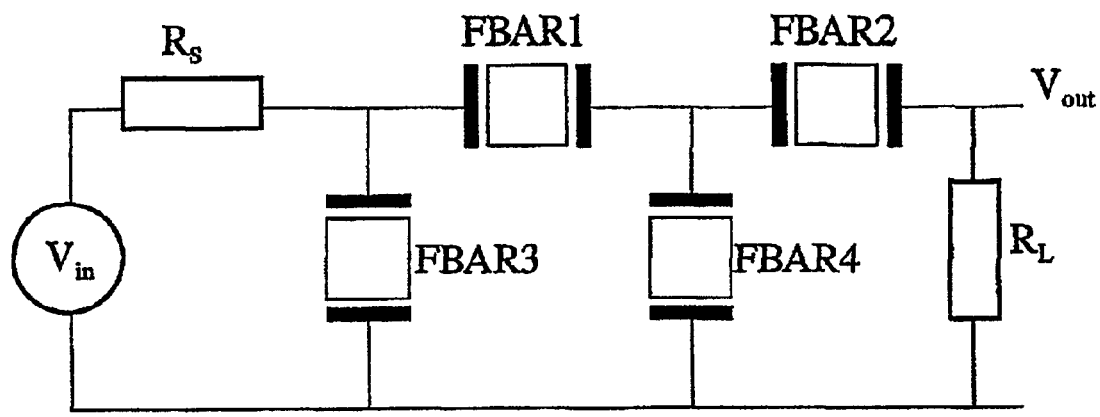
FIG. 7 illustrates a schematic diagram of electrical equivalent circuit for a filter which comprises two FBARs in series and two FBARs in parallel.
Figure 8:
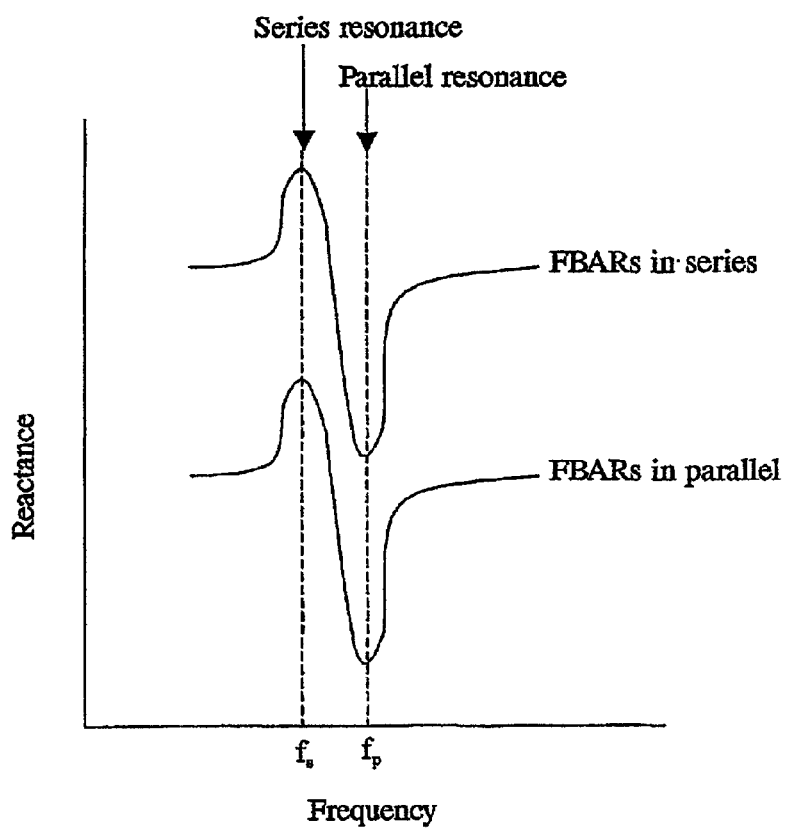
FIG. 8(a) illustrates the resonant curves of FBARs where the resonators in series and in parallel in a filter are identical.
FIG. 8(b) illustrates a $S_{21}$ curve of a filter which comprises four Identical FBARs in which two FBARs are in series and two FBARs are in parallel.
Figure 8:
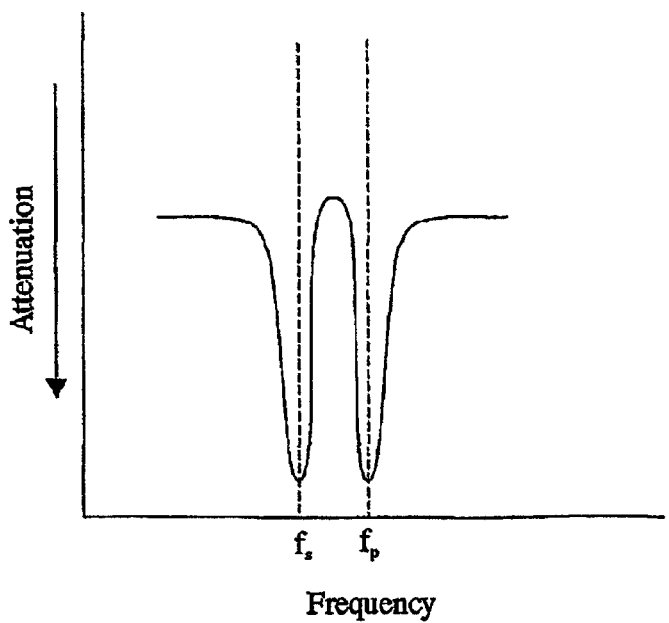
Figure 9:
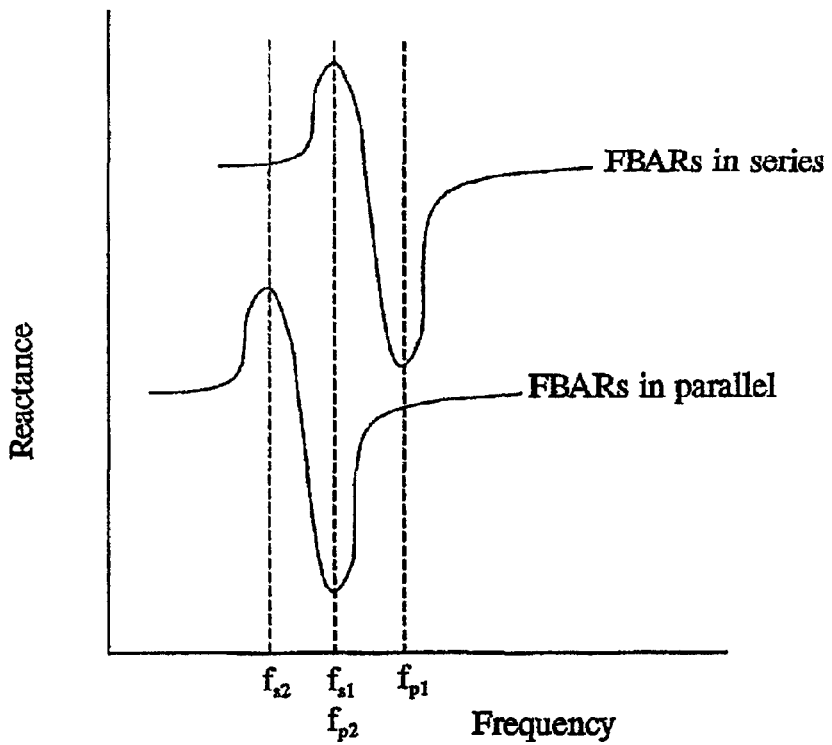
FIG. 9(a) illustrates resonant curves of FBARs where the resonators in series and in parallel in a filter possess different thicknesses of top electrodes for the FBARs in series relative to the FBARs in parallel.
FIG. 9(b) illustrates a $S_{21}$ curve of a filter which comprises four FBARs, where the two FBARs in series possess the same top electrode thickness which is different from that of the two FBARs in parallel.
Figure 9:
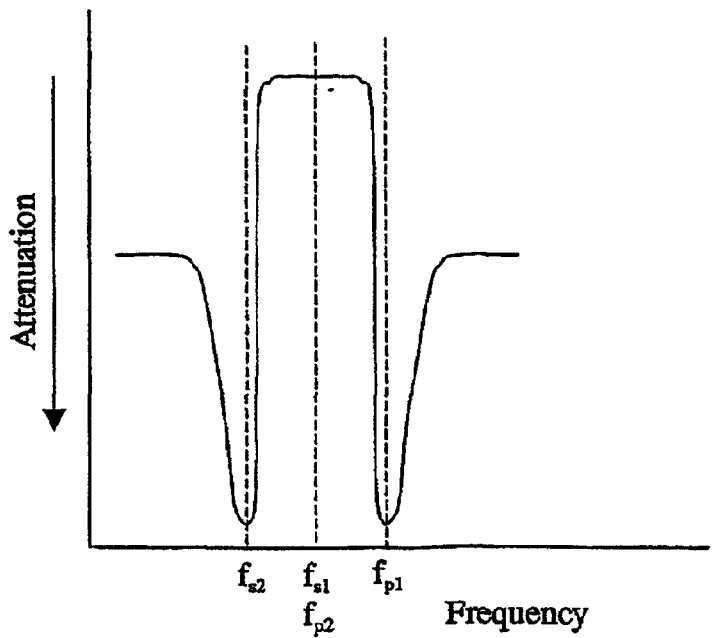

To compare with the preferred filter above, a filter is fabricated using the same configuration in FIG. 1, which comprises the same FBARs for both FBARs in series 10 and FBARs in parallel 11. On the compared filter, FBARs for both FBARs in series 10 and FBARs in parallel 11 comprise a top electrode 24 at 100 nm. $S_{21}$ of the compared filter is shown in FIG. 6. In FIG. 6, close-in rejections of the filter appear at 1.587 GHz and at 1.635 GHz. Those frequencies depend on resonant peaks of a FBAR in FIG. 3. Peak depth of a close-in rejection at 1.587 GHz is about −40 dB which is much worse than −60 dB at 1.538 GHz in FIG. 5. Moreover, in FIG. 6, a signal level in the band-pass area which is between both close-in rejections is about −20 dB which is not so good as −2 dB in FIG. 5. The width from one close-in rejection to the other close-in rejection is 0.048 GHz which is almost the half of the close-in rejection width on the preferred filter.

Comparing the preferred filter with the compared filter which comprises the same FBARs for both FBARs in series 10 and FBARs in parallel 11, the preferred filter shows a wider band-pass region, a lower insertion loss in a band-pass area and a deep close-in rejection. Thus, the preferred filter possesses many merits relative to the filter which comprises the same FBARs for both FBARs in series 10 and FBARs in parallel 11.

The preferred filter written above is only one example of this invention. Thus, the thin film techniques and materials for any or each layer of the preferred filter described above is not restricted to that described. For example, the material for the piezoelectric layer 23 is not restricted to be ZnO. Aluminium nitride (AlN) which shows a high Q value and lead titanate zirconate (PZT) which shows a large electro-mechanical coefficient could be used as alternatives. Also, lead scandium tantalum oxide and bismuth sodium titanium oxide could be used as alternatives. The material for the top electrode 24 and bottom electrode 25 is not restricted to be Cr/Au. Aluminium (Al) and platinum (Pt), which are often used for electrodes could be used as alternatives. The material for the membrane layer 22 and the backside pattern layer 21 is not restricted to be SiN$_x$. SiO$_2$ could be used as an alternative.

The numbers of FBARs in series 10 and FBARs in parallel 11 are not restricted to 3 each. The numbers of FBARs in series 10 and FBARs in parallel 11 should be decided by the need for a particular level of close-in rejection, the required area size for the filter and so on.

Figure 10:
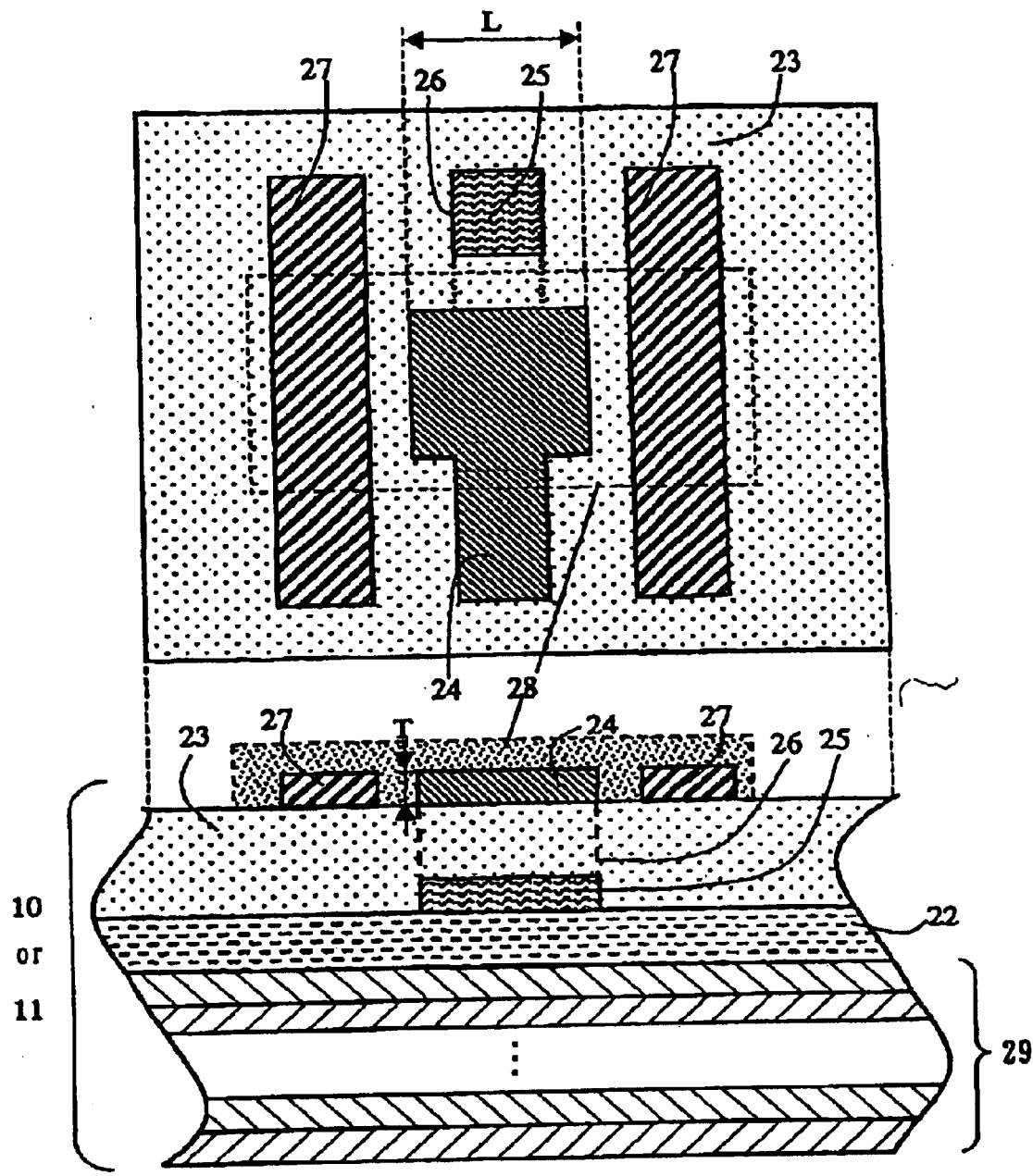
FIG. 10 illustrates a top view and a cross section view of a FBAR in which an acoustic reflective stack is used.

FBARs which are used as an FBAR in series 10 and an FBAR in parallel 11, are not restricted to be an FBAR which comprises an etched hole on Si wafer 20 at the backside of a bottom electrode 25. An air gap or a Bragg reflector (acoustic reflective stack, 29 as shown in FIG. 10 may be used at the backside of a bottom electrode 25 instead of an etched hole on Si wafer 20. Hence a Si wafer 20 is not necessarily the only type of substrate which can be used for the FBARs.

Because the preferred filter described above is one example, it is not essential to alter the thickness of the top electrode 24. An alternative process is described as follows. In order to alter the resonant frequency on FBARs in series 10, another layer which could be a dielectric, for example SiN$_x$ or SiO$_2$, or a metal (e.g. Au) can be prepared onto a working area of the top electrode 24. This is shown as an optional upper layer 28 in FIG. 2. Alternatively the thickness of the underlying dielectric layer 22 or the bottom electrode 25 can be varied for the FBARs in series relative to the FBARs in parallel to achieve a similar effect on the final filter. Alternatively, the etching process for the underlying substrate can be controlled to leave a certain quantity of residual substrate under each resonator, the amount left being allowed to vary in a controlled way for the substrates in series relative to the substrates in parallel. It will readily be appreciated that in another version of this filter type, the thicknesses of any two or more of these described layers (other than the piezoelectric layer) can be varied together to achieve similar effects.

What is claimed is:

1. An electric filter comprising a plurality of thin film bulk acoustic resonators (FBARs) linked in a series/parallel arrangement wherein:
   each resonator is made up of a thin piezoelectric layer made of a piezoelectric material and sandwiched between two metal electrodes, and other layers of materials;
   the thicknesses of the non-piezoelectric layers in the FBARs in the filter are varied one-from another;
   the filter has two close-in rejections, at least one of which is deeper as compared with a case where the thicknesses of respective layers in the FBARs are the same among all the FBARs; and
   the piezoelectric material is substantially lead scandium tantalum oxide.

2. An electric filter as described in claim 1, wherein the piezoelectric sandwich structure is supported on a thin membrane layer.

3. An electric filter as described in claim 1, wherein the piezoelectric sandwiched structure is supported on an acoustic reflective stack.

4. An electric filter as described in claim 1, wherein the layer whose thickness is varied from one FBAR to another is the top electrode.

5. An electric filter as described in claim 1, wherein the layer whose thickness is varied from one FBAR to another is the bottom electrode.

6. An electric filter as described in claim 1, wherein the layer whose thickness is varied from one FBAR to another is an underlying membrane.

7. An electric filter as described in claim 6, wherein the underlying membrane is silicon nitride.

8. An electric filter as described in claim 6, wherein the underlying membrane is silicon oxide.

9. An electric filter as described in claim 1, wherein the layer whose thickness is varied from one FBAR to another is an overlying dielectric layer.

10. An electric filter as described in claim 9, wherein the overlying dielectric layer is silicon nitride.

11. An electric filter as described in claim 9, wherein the overlying dielectric layer is silicon oxide.

12. An electric filter as described in claim 1, wherein the layer whose thickness is varied from one FBAR to another is an overlying metal layer.

13. An electric filter according to claim 1 comprising a plurality of FBARs linked in series and a plurality of FBARs linked in parallel.

14. An electric filter as described in claim 1, wherein the metal electrodes are substantially gold.

15. An electric filter as described in claim 1, wherein the metal electrodes are substantially aluminium.

16. An electric filter as described in claim 1, wherein the metal electrodes are substantially platinum.

17. An electric filter as described in claim 1, wherein the variation in the thickness of one of the layers is produced by etching by excimer laser pulses.

18. An electric filter as described in claim 1, wherein the variation in the thickness of one of the layers is produced by wet etching.

19. An electric filter as described in claim 1, wherein the variation in the thickness of one of the layers is produced by ion milling.

20. An electric filter as described in claim 1, wherein the variation in the thickness of one of the layers is produced by reactive ion etching.

21. An electric filter comprising at least one FBAR in series and at least one FBAR in parallel, each FBAR having a piezoelectric layer made of a piezoelectric material and sandwiched between two electrodes, wherein:
   the thicknesses of one or more non-piezoelectric layers in the series FBAR are different from those in the parallel FRAR;
   the filter has a lower minimum insertion loss in a band pass area as compared with a case where the thicknesses of respective layers in the FBARs are the same among all the FBARs; and
   the piezoelectric material is substantially lead scandium tantalum oxide.

22. An electric filter according to claim 21, wherein the thickness of at least one electrode is different between the FBAR in series and the FBAR in parallel.

23. An electric filter according to claim 21, wherein at least one additional layer is provided over the top electrode or under the bottom electrode.

24. An electric filter according to claim 23 wherein the thickness of the additional layer is different between the FBAR in series and the FBAR in parallel.

25. An electric filter comprising at least one FBAR in series and at least one FBAR in parallel, each FBAR having a piezoelectric layer made of a piezoelectric material and sandwiched between two electrodes wherein:
   the thicknesses of one or more non-piezoelectric layers in the series FBAR are different from those in the parallel FBAR;
   the filter has two close-in rejections, at least one of which is deeper as compared with a case where the thicknesses of respective layers in the FBARs are the same among all the FBARs; and
   the piezoelectric material is substantially lead scandium tantalum oxide.

26. An electric filter according to claim 25, wherein the thickness of at least one electrode is different between the FBAR in series and the FBAR in parallel.

27. An electric filter according to claim 25, wherein at least one additional layer is provided over the top electrode or under the bottom electrode.

28. An electric filter according to claim 27 wherein the thickness of the additional layer is different between the FBAR in series and the FBAR in parallel.

29. An electric filter comprising a plurality of thin film bulk acoustic resonators (FBARs) linked in a series/parallel arrangement wherein:
   each resonator is made up of a thin piezoelectric layer made of a piezoelectric material and sandwiched between two metal electrodes, and other layers of materials;
   the thicknesses of the non-piezoelectric layers in the FBARs in the filter are varied one from another;
   the filter has a lower minimum insertion loss in a band pass area as compared with a case where the thicknesses of respective layers in the FBARs are the same among all the FBARs; and the piezoelectric material is substantially lead scandium tantalum oxide.

30. An electric filter according to claim 29, comprising a plurality of FBARs linked in series and a plurality of FBARs linked in parallel.

31. An electric filter as described in claim 29, wherein the piezoelectric sandwich structure is supported on a thin membrane layer.

32. An electric filter as described in claim 29, wherein the piezoelectric sandwiched structure is supported on an acoustic reflective stack.

33. An electric filter as described in claim 29, wherein the layer whose thickness is varied from one FBAR to another is the top electrode.

34. An electric filter as described in claim 29, wherein the layer whose thickness is varied from one FBAR to another is the bottom electrode.

35. An electric filter as described in claim 29, wherein the layer whose thickness is varied from one FBAR to another is an underlying membrane.

36. An electric filter as described in claim 35, wherein the underlying membrane is silicon nitride.

37. An electric filter as described in claim 35, wherein the underlying membrane is silicon oxide.

38. An electric filter as described in claim 29, wherein the layer whose thickness is varied from one FBAR to another is an overlying dielectric layer.

39. An electric filter as described in claim 38, wherein the overlying dielectric layer is silicon nitride.

40. An electric filter as described in claim 38, wherein the overlying dielectric layer is silicon nitride.

41. An electric filter as described in claim 29, wherein the layer whose thickness is varied from one FBAR to another is an overlying metal layer.

42. An electric filter as described in claim 29, wherein the metal electrodes are substantially gold.

43. An electric filter as described in claim 29, wherein the metal electrodes are substantially aluminum.

44. An electric filter as described in claim 29, wherein the metal electrodes are substantially platinum.

45. An electric filter as described in claim 29, wherein the variation in the thickness of one of the layers is produced by etching by excimer laser pulses.

46. An electric filter as described in claim 29, wherein the variation in the thickness of one of the layers is produced by wet etching.

47. An electric filter as described in claim 29, wherein the variation in the thickness of one of the layers is produced by ion milling.

48. An electric filter as described in claim 29, wherein the variation in the thickness of one of the layers is produced by reactive ion etching.

* * * * *

UNITED STATES PATENT AND TRADEMARK OFFICE
CERTIFICATE OF CORRECTION

PATENT NO.    : 6,774,746 B2
DATED         : August 10, 2004
INVENTOR(S)   : Roger W. Whatmore et al.

It is certified that error appears in the above-identified patent and that said Letters Patent is hereby corrected as shown below:

Column 6,
Line 56, replace "stack" with -- stack) --.

Column 8,
Line 18, replace "FRAR" with -- FBAR --.
Line 37, replace "electrodes" with -- electrodes, --.

Signed and Sealed this

Eleventh Day of January, 2005

JON W. DUDAS
*Director of the United States Patent and Trademark Office*